(12) United States Patent
Brubaker

(10) Patent No.: US 8,397,186 B2
(45) Date of Patent: Mar. 12, 2013

(54) TECHNIQUE FOR REPLAYING OPERATIONS USING REPLAY LOOK-AHEAD INSTRUCTIONS

(75) Inventor: Jeffrey T. Brubaker, Carrboro, NC (US)

(73) Assignee: Synopsys, Inc., Mountain View, CA (US)

( * ) Notice: Subject to any disclaimer, the term of this patent is extended or adjusted under 35 U.S.C. 154(b) by 712 days.

(21) Appl. No.: 12/610,233

(22) Filed: Oct. 30, 2009

(65) Prior Publication Data

US 2011/0016294 A1 Jan. 20, 2011

Related U.S. Application Data

(60) Provisional application No. 61/226,155, filed on Jul. 16, 2009.

(51) Int. Cl.
*G06G 7/62* (2006.01)
*G06G 7/54* (2006.01)
*G06F 17/50* (2006.01)
*G06F 9/455* (2006.01)
*G06F 9/45* (2006.01)
*G06F 9/445* (2006.01)
*G06F 9/40* (2006.01)
*G06F 9/30* (2006.01)

(52) U.S. Cl. .......... 716/106; 716/111; 716/136; 703/16; 703/17; 703/26; 703/27; 703/28; 717/104; 717/128; 717/138; 712/201; 712/244

(58) Field of Classification Search .................. 716/106, 716/111, 136; 703/16, 17, 26, 27, 28; 717/104, 717/128, 138; 712/201, 244
See application file for complete search history.

(56) References Cited

U.S. PATENT DOCUMENTS

| | | | | |
|---|---|---|---|---|
| 4,761,731 | A * | 8/1988 | Webb | 711/156 |
| 6,272,453 | B1 * | 8/2001 | Hoerig et al. | 703/27 |
| 6,446,190 | B1 * | 9/2002 | Barry et al. | 712/24 |
| 6,937,973 | B1 * | 8/2005 | Panesar | 703/21 |
| 7,536,380 | B2 * | 5/2009 | Muras | 1/1 |
| 7,730,468 | B1 * | 6/2010 | Trowbridge | 717/148 |
| 8,230,200 | B2 * | 7/2012 | Imamichi | 712/208 |
| 8,239,841 | B2 * | 8/2012 | Chen et al. | 717/140 |
| 2005/0010880 | A1 * | 1/2005 | Schubert et al. | 716/4 |
| 2005/0229149 | A1 * | 10/2005 | Munter et al. | 717/100 |
| 2006/0174232 | A1 * | 8/2006 | McCalla et al. | 717/139 |
| 2007/0233442 | A1 * | 10/2007 | Ito et al. | 703/13 |
| 2008/0244325 | A1 * | 10/2008 | Tyulenev | 714/38 |
| 2010/0281282 | A1 * | 11/2010 | Sawyers | 713/323 |
| 2012/0084540 | A1 * | 4/2012 | Lichtensteiger et al. | 712/244 |

* cited by examiner

*Primary Examiner* — Phallaka Kik

(74) *Attorney, Agent, or Firm* — Park, Vaughan, Fleming & Dowler LLP; Laxman Sahasrabuddhe

(57) ABSTRACT

A technique for reliably replaying operations in electronic-design-automation (EDA) software is described. In this technique, the EDA software stores operations performed by a user during a design session, as well as any replay look-ahead instructions, in a log file. When repeating the first operation, the replay look-ahead instruction ensures that the same state is obtained in the EDA environment as was previously obtained. For example, if an interrupt occurred when the first operation was previously performed, the replay look-ahead instruction may specify when the interrupt occurred during the performance of the operation so that the effect of the interrupt may be simulated when replaying the first operation. Alternatively, if a blocking user-interface request occurred when the first operation was previously performed (such as a mandatory query), the replay look-ahead instruction may include one or more events associated with the user answer to the blocking user-interface request so that the same user answer may be provided when replaying the first operation.

25 Claims, 4 Drawing Sheets

METHOD 200

ACCESS A SEQUENCE OF OPERATIONS AND AT LEAST ONE REPLAY LOOK-AHEAD INSTRUCTION IN A LOG FILE ASSOCIATED WITH AN *EDA* ENVIRONMENT
210

PERFORM THE SEQUENCE OF OPERATIONS, WHERE A FIRST OPERATION IN THE SEQUENCE OF OPERATIONS IS PERFORMED USING THE REPLAY LOOK-AHEAD INSTRUCTION
212

TECHNIQUE FOR REPLAYING OPERATIONS USING REPLAY LOOK-AHEAD INSTRUCTIONS

CROSS REFERENCE TO RELATED APPLICATIONS

This application claims priority under 35 U.S.C. 119(e) to U.S. Provisional Application Ser. No. 61/226,155, entitled "Replay Look-Ahead," by Jeffrey Thomas Brubaker, filed on Jul. 16, 2009, the contents of which are herein incorporated by reference.

BACKGROUND

1. Field

This disclosure generally relates to electronic design automation. More specifically, this invention relates to a technique for reproducibly obtaining a state in an electronic-design-automation environment by replaying operations using replay look-ahead instructions.

2. Related Art

Electronic-design-automation (EDA) software is widely used to design circuits. Typically, EDA software maintains a log file of all commands or operations performed by a user during a design session. These stored operations are often repeated (which is sometimes referred to as 'replayed') in order to: debug a circuit design and/or to program the EDA software to perform batch operations. Note that replaying at least a subset of the stored operations in a log file is sometimes referred to as 'replaying' the subset of the operations.

In order to be useful to designers, replay should reliable. Therefore, ideally all of the operations a user may perform using EDA software should support replay. Furthermore, after replaying a sequence of one or more of these operations, the same state in the EDA software should be reproducibly obtained. However, these reliability requirements are often not achieved using existing EDA software.

For example, the log files associated with existing EDA software often do not include information with sufficient temporal granularity to reproducibly obtain the same state in the EDA software when operations are replayed. In particular, a log file may include a particular operation that was performed, but may not include a conditional event that occurred during this operation. As a consequence, when this operation is subsequently replayed, the occurrence of the conditional event and the previous user response are unknown, so the correct state in the EDA software is not obtained.

This lack of reproducibility increases the time and effort needed to design circuits, thereby increasing their cost. In addition, by undermining the user's perception of the reliability of features, such as replay, the user experience is degraded, which can impact customer retention and sales of EDA software.

SUMMARY

One embodiment of the present disclosure provides a computer system that replays a sequence of operations, which were previously performed by a user, in an electronic-design-automation (EDA) environment, such as that provided by EDA software. During operation, the computer system accesses the sequence of operations and at least one replay look-ahead instruction in a log file associated with the EDA environment. Note that the replay look-ahead instruction provides operational information, which specifies how a first operation in the sequence of operations is to be performed. Moreover, in the absence of the replay look-ahead instruction, replaying the first operation does not result in the same state in the EDA environment as occurred when the first operation was previously performed by the user. Then, the computer system performs the sequence of operations, where performing the first operation in the sequence of operations is based at least on the replay look-ahead instruction.

In some embodiments, the replay look-ahead instruction is associated with an interrupt, provided by the user, when the first operation was previously performed. (For example, the interrupt may indicate that the user pressed 'Ctrl-C' to interrupt an operation or, based on a displayed progress bar, the user may have pressed a 'cancel' button to interrupt an operation.) This replay look-ahead instruction may specify when the interrupt occurred during the performance of the first operation. Furthermore, when replaying the first operation, the effect of the interrupt may be simulated, thereby achieving the same state in the EDA environment as occurred when the first operation was previously performed by the user.

In some embodiments, the replay look-ahead instruction is associated with a blocking user-interface request that occurred when the first operation was previously performed. Note that a user answer to the blocking user-interface request is required in order for the first operation to complete. Moreover, when the first operation was previously performed by the user, the user answer included a sequence of events. When replaying the first operation, the sequence of events may be simulated to provide the user answer, thereby achieving the same state in the EDA environment as occurred when the first operation was previously performed by the user.

In some embodiments, the replay look-ahead instruction is associated with one or more user preferences that specify a configuration of the EDA environment. For example, the configuration of the EDA environment may include a window size and/or position. Furthermore, when replaying the first operation, a window in a graphical user interface may be configured based at least on the window size and/or position, thereby achieving the same state in the EDA environment as occurred when the first operation was previously performed by the user. Note that the same state may be achieved in the EDA environment when replaying the first operation even if a display size is different relative to a display size when the first operation was previously performed by the user. Alternatively or additionally, the same state may be achieved in the EDA environment when replaying the first operation even if an original user's preferences are unavailable to the user performing the replay, which can occur when bug reports are submitted.

Another embodiment provides a method including at least some of the above-described operations.

Another embodiment provides a computer-program product for use in conjunction with the computer system.

Figure 1:
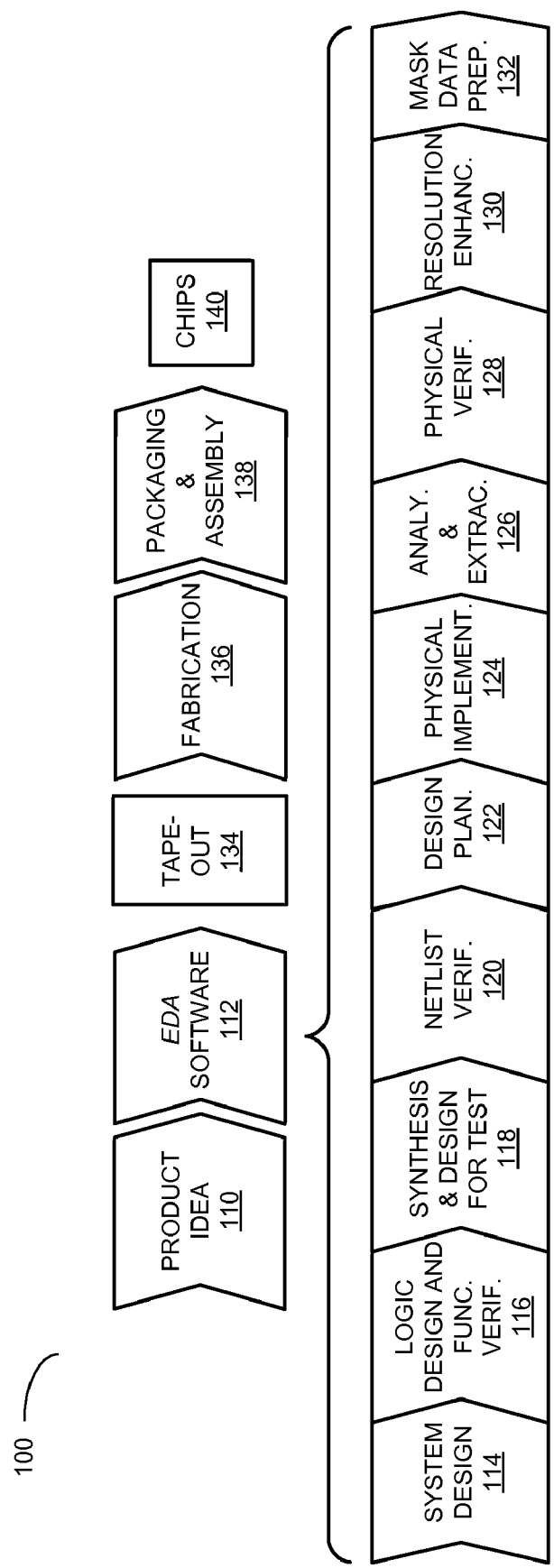
FIG. 1 is a flowchart illustrating various operations in the design and fabrication of an integrated circuit in accordance with an embodiment of the present disclosure.

Table 1 illustrates a log file in accordance with an embodiment of the present disclosure.

Table 2 illustrates pseudo-code for operations in accordance with an embodiment of the present disclosure.

Table 3 illustrates pseudo-code for operations in accordance with an embodiment of the present disclosure.

Note that like reference numerals refer to corresponding parts throughout the drawings. Moreover, multiple instances of the same type of part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a computer system, a method, and a computer-program product (i.e., software) for use with the computer system are described. During the method, commands or operations (which are henceforth referred to as operations) in an electronic-design-automation (EDA) environment, such as that provided by EDA software, are reliably replayed. In particular, the EDA software stores operations performed by a user during a design session, as well as any replay look-ahead instructions, in a log file. When replaying a first operation, the replay look-ahead instruction ensures that the same state is obtained in the EDA environment as was previously obtained. For example, if an interrupt occurred when the first operation was previously performed, the replay look-ahead instruction may specify when the interrupt occurred during the performance of the operation so that the effect of the interrupt may be simulated when replaying the first operation. Alternatively, if a blocking user-interface request occurred when the first operation was previously performed (such as a mandatory query), the replay look-ahead instruction may include one or more events associated with the user answer to the blocking user-interface request so that the same user answer may be provided when replaying the first operation.

By facilitating the same state in the EDA environment, this replay technique helps make the EDA software easier to use, which increases user productivity and lowers circuit development costs. In addition, by increasing reproducibility, the replay technique improves users' perception of the reliability of features, such as replay, which improves the user experience, and thus, customer retention and sales of EDA software.

We now describe embodiments of design and fabrication of integrated circuits or chips. FIG. 1 presents a flowchart 100 illustrating the various operations in the design and fabrication of an integrated circuit. This process starts with the generation of a product idea (110), which is realized during a design process that uses EDA software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below. This design flow description is for illustration purposes only. In particular, this description is not meant to limit the present disclosure. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect®, Saber®, System Studio®, and Designware® products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS®, Vera®, Designware®, Magellan®, Formality®, ESP® and Leda® products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality®, Primetime®, and VCS® products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro® and IC Compiler® products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro® and IC Compiler® products.

Then, during analysis and extraction (126), the circuit function is verified at a transistor level, which permits refinement. Exemplary EDA software products from Synopsys, Inc. of Mountain View, Calif. that can be used at this stage include: Astrorail®, Primerail®, Primetime®, and Star RC/XT® products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules® product.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus®, Proteus®AF, and PSMGED® products.

Additionally, during mask-data preparation (132), the 'tape-out' data for production of masks to produce finished chips is provided. Exemplary EDA software products from Synopsys, Inc. of Mountain View, Calif. that can be used at this stage include the Cats® family of products.

Embodiments of the present disclosure can be used during one or more of the above-described stages. Specifically, in some embodiments the present disclosure can be used in EDA software 112, which may provide a custom schematic editor and simulation environment.

Figure 2:
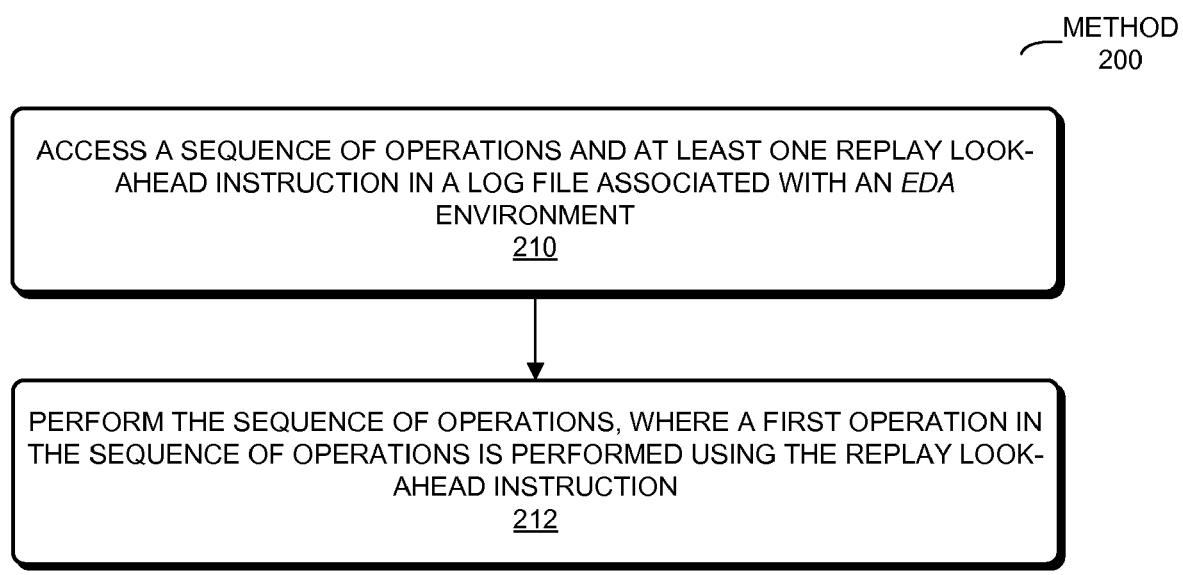
FIG. 2 is a flowchart illustrating a method for replaying a sequence of operations, which were previously performed by a user, in an electronic-design-automation (EDA) environment in accordance with an embodiment of the present disclosure.

We now describe embodiments of a technique for reliably replaying a sequence of operations. FIG. 2 presents a flow-chart illustrating a method 200 for replaying a sequence of operations, which were previously performed by a user, in an EDA environment, such as that provided by EDA software that executes on a computer system. During operation, the EDA software accesses the sequence of operations and at least one replay look-ahead instruction in a log file associated with the EDA environment (operation 210). Note that the replay look-ahead instruction provides operational information, which specifies how a first operation in the sequence of operations is to be performed. Moreover, in the absence of the replay look-ahead instruction, replaying the first operation does not result in the same state in the EDA environment as occurred when the first operation was previously performed by the user. Then, the EDA software performs the sequence of operations (operation 212), where performing the first operation in the sequence of operations is based at least on the replay look-ahead instruction.

In some embodiments of method 200 there are additional or fewer operations. Moreover, the order of the operations may be changed and/or two or more operations may be combined into a single operation.

Table 1 illustrates a log file, which is generated during one or more design sessions. This log file includes time-stamped entries for all of the operations in an EDA environment that were performed by a user, and which are associated with a circuit design. These operations are indicated by entries designated with a '/i' or a '/o' in the log file.

TABLE 1

[12:10:09.48] /i de::open [dm::findCellView {layout} -cellName {AD4FUL} -libName {ADFULG}]]
[12:10:09.49] /o Extracting net "net A"
[12:10:10.49] /o Extracting net "net B"
[12:10:11.49] /o Extracting net "net C"
[12:10:12.49] /o Extracting net "net D"
[12:10:12.49] /r deInterrupt <loopId:leExtractConnectivity> <positionId:net3>
[12:10:15.45] /r giDialog gi::pressButton {cancel} -in [gi::getDialogs {giPrompt}]

However, when a given operation is performed, a state may occur in the EDA environment that may not replay correctly (i.e., if the given operation is replayed the same state may not be obtained). For example, this problem may occur: if the user interrupts the given operation while it is being performed (for example, by hitting 'Ctrl-C' on a keyboard); if, in response to a user action or the given operation, a dialog box, which requires a mandatory response in order for the given operation to be performed, is displayed (which is sometimes referred to as a 'blocking dialog box'); and/or if user preferences are used to configure a graphical user interface (such as a window). (In some cases more than one blocking dialog box is displayed. For example, if a user runs out of disk space while saving a design, a dialog box may allow the user to save the design somewhere else (such as by pressing a 'Save As' button). In these embodiments, the button press and all inputs into the next dialog box (which asks where to save the design) may need to be replayed.) Note that in the first two examples, the incorrect state can be obtained during replay because the given operation was stopped after it had started but before it had completed.

To address this problem, when the operations are performed during the one or more design sessions, one or more replay look-ahead instructions (which may be indicated by entries designated with a '/r') may be included in the log file. The replay look-ahead instructions specify how a preceding operation (and, more generally, an adjacent or proximate operation) should be performed during replay so that the same state is obtained (therefore, the replay look-ahead instructions are sometimes referred to as 'look-ahead messages'). Note that the replay look-ahead instructions may each include an affected module or handler, and associated data. For example, if an interrupt occurred when a preceding operation in the log file was previously performed, the replay look-ahead instruction may indicate that it is associated with an interrupt handler, and the associated data may specify a location in the EDA software (such as a loop identifier, loopId, and a position identifier, positionId) where the interrupt occurred. During replay, the effect of the interrupt may be simulated at the location so that the same state in the EDA environment is obtained. Alternatively, if a blocking dialog box occurred when the preceding operation was previously performed, the replay look-ahead instruction may indicate that it is associated with a dialog replay module, and the associated data may include a sequence of one or more events (such as one or more TCL commands) that specify the user actions in response to the blocking dialog box (i.e., the mandatory user response or answer). Furthermore, if user preferences were loaded during the one or more design sessions to configure the EDA environment (such as one or more window(s)), the replay look-ahead instruction may indicate that it is associated with a window-framework module, and the associated data may include a window size and/or position. When the operations in the log file are replayed, one or more windows may be configured based on the window size and/or position. In this way, the visual presentation of the EDA environment may be unchanged during replay even if the display size is changed relative to the display used during the one or more design sessions.

As noted previously, in an exemplary embodiment an interrupt occurred during a design session. For example, a user may have opened a large circuit design (such as the 'de::open' operation on the first line of the log file in Table 1). In response, the EDA software may have opened the circuit design by extracting connectivity (via the 'leExtractConnectivity' operation), as indicated by the net names in the log file as it moves through the circuit design.

While waiting for a progress bar in a progress-indicator dialog box, the user may have hit Ctrl-C during extraction of net D. If the log file only includes the 'de::open' operation, it will not replay correctly, i.e., the same EDA-environment state will not be obtained. Consequently, the log file may include a replay look-ahead instruction that indicates that an interrupt occurred, as well as information specifying where the interrupt occurred during execution of the EDA software. Therefore, if the EDA software was in the process of walking through net D in the circuit design when the interrupt occurred, the replay look-ahead instruction may include the loopId and the positionId corresponding to net D, as shown in Table 1. (Note that, in response to the interrupt, the EDA software posted a blocking dialog box with the query "Are you sure?," which the user canceled.)

During replay, each operation in the log file may be read by a replay connectivity engine, and replay look-ahead instructions for interrupts immediately after operations may be placed into a look-ahead buffer. When executed, the given operation may query the look-ahead buffer, filtered by its service name (for example, using an application programming interface), to control its execution path. And after the given operation is performed, the look-ahead buffer may be cleared. Thus, based on the replay look-ahead instructions, when it reaches net D, the interrupt handler may simulate an interrupt at the correct location in the EDA software (as specified by the loopId and the position Id). This allows the EDA software to reproduce issues encountered when the user interrupted an operation that took a long time to run.

It is possible that when an interrupt occurs, the given operation cleans up and leaves the design-session and database states unchanged. However, it is also possible that some processing is skipped and that a partial result is obtained (for example, when connectivity extraction of a single net is cancelled). In this case, if the given operation is replayed without an interrupt the same system state will not be obtained.

In some embodiments, the EDA software includes utilities that: continue to respond to exposure events, report progress during a long operation and/or allow the user to interrupt either via a Cancel button or Ctrl-C. In particular, these utilities may include graphical and non-graphical support that presents a progress dialog box when the graphical user interface in the EDA software is enabled, and which outputs to a file when the graphical user interface in the EDA software is disabled. Moreover, the EDA software may support: Ctrl-C interrupt checking in both the graphical and non-graphical user interfaces; bounded (for example, percentages) and unbounded progress support so that operations without a definite end can report that work is being performed; passing of update/paint events to all widgets so that the EDA software continues to respond to exposures and feels 'alive;' and/or support for replaying interrupts (e.g., storing replay look-ahead instructions in a log file). For example, the EDA software may include two interfaces: one that provides unbounded interrupt checking and another that provides the progress display. Note that the unbounded interface may be stack managed for safety. Furthermore, more than one instance of this object may exist on the stack at a single time if, for example, an outer loop and an inner loop, which is called by the outer loop, each provide interrupt handling.

Note that, for proper replay, the loop identifier for interrupts associated with an operation entry in the log file may be unique. For example, if there are two instances of the interrupt handler in a single operation in the log file, replay may not simulate the two interrupts correctly. This problem is illustrated in Table 2, which includes pseudo-code for operations. In particular, the same loop identifier (loopId) is used for two separate interrupt handlers even though there will be only a single /r entry in the log file. This example will not replay properly unless 'theName' is replaced with a unique name for each call to the do_something procedure.

TABLE 2

```
procedure do_something { } {
    set i [db::createInterruptHandler theName]
    for {set j 0} {$j < 10} {incr j} {
        puts $j
        db::checkForInterrupt "iteration$j" -handler $i
    }
    db::destroy $i
}
db::eval {
```

TABLE 2-continued

```
    do_something
    do_something
}
```

In another exemplary embodiment, the log file supports replay of an operation that had a blocking state during its execution in the design session. Note that a block state may be associated with a modal or blocking dialog box (such as a dialog box that indicates "Are you sure?" or an error notification), which requires a user response or answer before the EDA software will complete execution of an associated operation. For example, when a user attempts to delete a file in a library manager, the user is prompted to confirm the request or the delete operation will not be performed. Consequently, during replay, the same answer or response will need to be provided or the same state in the EDA environment will not be obtained.

Another illustration is shown in Table 3, which includes pseudo-code for operations. If an error is encountered during dm::createLib, which results in the display of a modal dialog box, dm::createLib is not performed until the user dismisses the modal dialog box. As a consequence, the gi::pressButton operation does not execute, even though it was logged to press a button in the modal dialog box. Consequently, without the appropriate user response, replay will not continue correctly.

TABLE 3

```
lm::showCreateLibrary
dm::createLib libName -path libPath -dmSystem oaDMTurbo
gi::pressButton ok -in [gi::getDialogs dmCreateLibrary]
```

To address this type of problem, a replay look-ahead instruction included in the log file may indicate that a blocking dialog box occurred, and may include a sequence of one or more events associated with the user answer or response (i.e., the user interaction with the blocking dialog box). When this sequence of events is performed in the blocking dialog box during replay, the same state in the EDA environment may be obtained. For example, as shown in Table 1, in response to the "Are you sure?" blocking dialog box, the user response is "Cancel," which allows the 'de::open' operation to return.

Note that in some embodiments replay look-ahead instructions associated with a blocking dialog box are designated with a '/r' in the log file. During replay, before presenting or posting the blocking dialog box, these /r entries may be read into a read-ahead buffer. Then, the preceding operation in the log file that posts the blocking dialog box may be evaluated using the information in the read-ahead buffer.

In some embodiments, operations are evaluated one at a time. If these operations post additional blocking dialog boxes, then these dialog boxes will be evaluated using entries in the read-ahead buffer. The last entry in the read-ahead buffer commits or cancels the blocking dialog box, which causes the operation that posted the blocking dialog box to complete and return control to the EDA software. This capability allows blocking dialog boxes to be logged and replayed.

Figure 3:
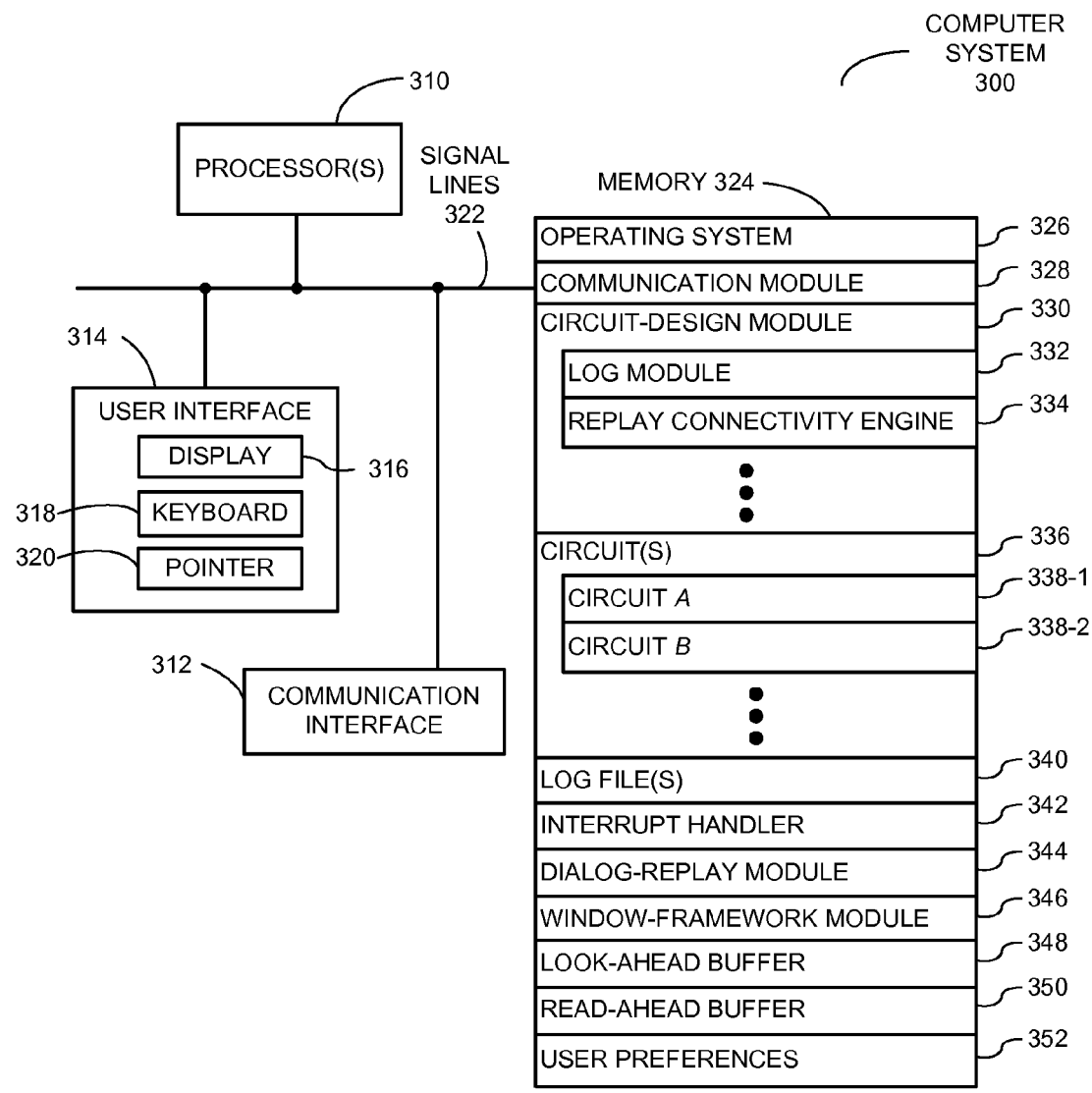
FIG. 3 is a block diagram illustrating a computer system that performs the method of FIG. 2 in accordance with an embodiment of the present disclosure.

We now describe embodiments of a computer system that reliably replays a sequence of operations. FIG. 3 presents a block diagram illustrating a computer system 300 that performs method 200 (FIG. 2). Computer system 300 includes: one or more processors 310, a communication interface 312, a user interface 314, and one or more signal lines 322 coupling these components together. Note that the one or more processing units 310 may support parallel processing and/or multi-threaded operation, the communication interface 312 may have a persistent communication connection, and the one or more signal lines 322 may constitute a communication bus. Moreover, the user interface 314 may include: a display 316, a keyboard 318, and/or a pointer 320, such as a mouse.

Memory 324 in computer system 300 may include volatile memory and/or non-volatile memory. More specifically, memory 324 may include: ROM, RAM, EPROM, EEPROM, flash, one or more smart cards, one or more magnetic disc storage devices, and/or one or more optical storage devices. Memory 324 may store an operating system 326 that includes procedures (or a set of instructions) for handling various basic system services for performing hardware-dependent tasks. Memory 324 may also store procedures (or a set of instructions) in a communication module 328. These communication procedures may be used for communicating with one or more computers and/or servers, including computers and/or servers that are remotely located with respect to computer system 300.

Memory 324 may also include multiple program modules (or sets of instructions), including: circuit-design module 330 (or a set of instructions), interrupt handler 342 (or a set of instructions), dialog-replay module 344 (or a set of instructions) and/or window-framework module 346 (or a set of instructions). Moreover, circuit-design module 330 may include: log module 332 (or a set of instructions) and/or replay connectivity engine 334 (or a set of instructions). Note that one or more of these program modules (or sets of instructions) may constitute a computer-program mechanism.

During a design session, a user may use circuit-design module 330 to edit or simulate one or more circuits 336, such as: circuit A 338-1 and/or circuit B 338-2. Moreover, log module 332 may store entries associated with operations in an EDA environment provided by circuit-design module 330 in one or more log files 340. Note that if an operation did not complete (for example, because of an interrupt) or a blocking dialog state occurred during execution of an operation, then log module 332 may store replay look-ahead instructions for the operation in the one or more log files 340. In addition, user preferences 352, which may be loaded by circuit-design module 330 at the start of a design session, may be stored by log module 332 as one or more replay look-ahead instructions in the one or more log files 340.

Subsequently, during replay, replay connectivity engine 334 may use the operations and the replay look-ahead instructions in the one or more log files 340 to ensure that the same state is obtained in the EDA environment as during the design session. For example, if there were one or more interrupt(s) during an operation, replay connectivity engine 334 may store the replay look-ahead instruction(s) in look-ahead buffer 348. Then, interrupt handler 342 may use this information to simulate interrupt(s) at the appropriate location(s) in circuit-design module 330.

Alternatively, if a blocking state occurred during an operation, replay connectivity engine 334 may store the replay look-ahead instruction (such as a sequence of one or more events associated with the user response or answer to a blocking dialog box) in read-ahead buffer 350. Then, dialog-replay module 344 may use this information to provide the user response or answer when the blocking dialog box occurs during replay.

Furthermore, window-framework module 346 may use window-size information in the replay look-ahead instructions to ensure that the visual presentation of one or more windows in a graphical user interface associated with circuit-design module 330 is unchanged during replay relative to the design session, even if display 316 is changed.

Instructions in the various modules in the memory 324 may be implemented in: a high-level procedural language, an object-oriented programming language, and/or in an assembly or machine language. Note that the programming language may be compiled or interpreted, e.g., configurable or configured, to be executed by the one or more processing units 310.

Computer system 300 may include a variety of devices, such as: a personal computer, a laptop computer, a server, a work station, a main-frame computer, and/or other device capable of manipulating computer-readable data.

Although computer system 300 is illustrated as having a number of discrete items, FIG. 3 is intended to be a functional description of the various features that may be present in computer system 300 rather than a structural schematic of the embodiments described herein. In practice, and as recognized by those of ordinary skill in the art, the functions of computer system 300 may be distributed over a large number of servers or computers, with various groups of the servers or computers performing particular subsets of the functions. Consequently, computer system 300 may be at one location or may be distributed across multiple locations, such as computing systems that communicate via a network (such as the Internet or an intranet).

In some embodiments, some or all of the functionality of computer system 300 may be implemented in one or more: application-specific integrated circuit (ASICs), field-programmable gate array (FPGAs), and/or one or more digital signal processors (DSPs). Note that the functionality of computer system 300 may be implemented more in hardware and less in software, or less in hardware and more in software, as is known in the art.

Figure 4:
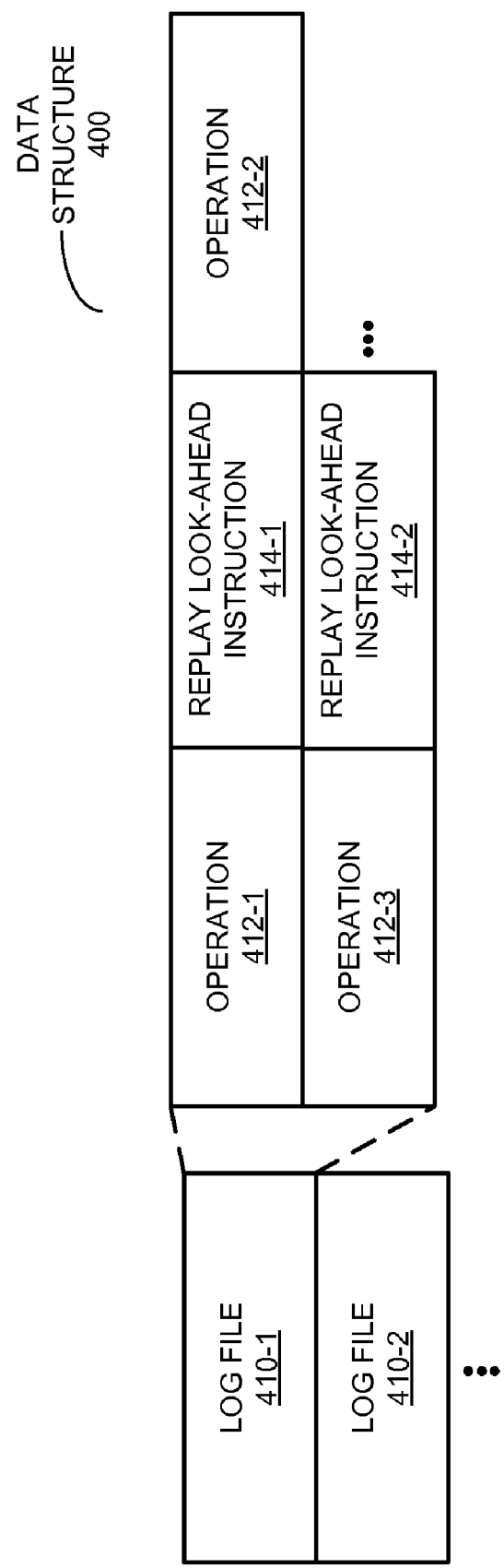
FIG. 4 is a block diagram illustrating a data structure for use in conjunction with the computer system of FIG. 3 in accordance with an embodiment of the present disclosure.

We now discuss embodiments of data structures that may be used in computer system 300. FIG. 4 presents a block diagram illustrating a data structure 400. This data structure may include one or more log files 410, which may be associated with corresponding design sessions. For example, log file 410-1 may include operations 412, and, for at least some of operations 412, replay look-ahead instructions 414. Thus, replay look-ahead instruction 414-1 may include information about a sequence of one or more events associated with a user answer or response to a blocking dialog box that occurred during operation 412-1 in a design session, and replay look-ahead instruction 414-2 may include information about an interrupt that occurred during operation 412-3 in the design session.

In some embodiments, computer system 300 (FIG. 3) and/or data structures 400 include fewer or additional components. Moreover, two or more components may be combined into a single component and/or a position of one or more components may be changed.

While the preceding embodiments have used EDA software as an illustrative example, the technique for reliably replaying operations may be used with a wide variety of software, including: software applications, software development tools, firmware, operating systems and/or software testing tools.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A computer-implemented method for replaying a sequence of operations, which were previously performed by a user, in an electronic-design-automation (EDA) environment, comprising:
a computer accessing the sequence of operations and at least one replay look-ahead instruction in a log file associated with the EDA environment, wherein the replay look-ahead instruction provides operational information, which specifies how a first operation in the sequence of operations is to be performed, and wherein, in the absence of the replay look-ahead instruction, replaying the first operation does not result in the same state in the EDA environment as occurred when the first operation was previously performed by the user; and
the computer performing the sequence of operations, wherein performing the first operation in the sequence of operations is based at least on the replay look-ahead instruction.

2. The method of claim 1, wherein the replay look-ahead instruction is associated with an interrupt, provided by the user, when the first operation was previously performed.

3. The method of claim 2, wherein the replay look-ahead instruction specifies when the interrupt occurred during the performance of the first operation.

4. The method of claim 3, wherein, when replaying the first operation, the effect of the interrupt is simulated, thereby achieving the same state in the EDA environment as occurred when the first operation was previously performed by the user.

5. The method of claim 1, wherein the replay look-ahead instruction is associated with a blocking user-interface request that occurred when the first operation was previously performed; and
wherein a user answer to the blocking user-interface request is required in order for the first operation to complete.

6. The method of claim 5, wherein when the first operation was previously performed by the user, the user answer included a sequence of events.

7. The method of claim 6, wherein, when replaying the first operation, the sequence of events are simulated to provide the user answer, thereby achieving the same state in the EDA environment as occurred when the first operation was previously performed by the user.

8. The method of claim 1, wherein the replay look-ahead instruction is associated with one or more user preferences that specify a configuration of the EDA environment.

9. The method of claim 8, wherein the configuration of the EDA environment includes a window size.

10. The method of claim 9, wherein, when replaying the first operation, a window in a graphical user interface is configured based at least on the window size, thereby achieving the same state in the EDA environment as occurred when the first operation was previously performed by the user.

11. The method of claim 10, wherein the same state is achieved in the EDA environment during the replay of the first operation even if a display size is different relative to a display size when the first operation was previously performed by the user.

12. A computer-program product for use in conjunction with a computer system, the computer-program product comprising a computer-readable storage device and a computer-program mechanism embedded therein for replaying a sequence of operations, which were previously performed by a user, in an EDA environment, comprising:
instructions for accessing the sequence of operations and at least one replay look-ahead instruction in a log file associated with the EDA environment, wherein the replay look-ahead instruction provides operational information, which specifies how a first operation in the sequence of operations is to be performed, and wherein, in the absence of the replay look-ahead instruction, replaying the first operation does not result in the same state in the EDA environment as occurred when the first operation was previously performed by the user; and
instructions for performing the sequence of operations, wherein performing the first operation in the sequence of operations is based at least on the replay look-ahead instruction.

13. The computer-program product of claim 12, wherein the replay look-ahead instruction is associated with an interrupt, provided by the user, when the first operation was previously performed.

14. The computer-program product of claim 13, wherein the replay look-ahead instruction specifies when the interrupt occurred during the performance of the first operation.

15. The computer-program product of claim 14, wherein, when replaying the first operation, the effect of the interrupt is simulated, thereby achieving the same state in the EDA environment as occurred when the first operation was previously performed by the user.

16. The computer-program product of claim 12, wherein the replay look-ahead instruction is associated with a blocking user-interface request that occurred when the first operation was previously performed; and
wherein a user answer to the blocking user-interface request is required in order for the first operation to complete.

17. The computer-program product of claim 16, wherein when the first operation was previously performed by the user, the user answer included a sequence of events.

18. The computer-program product of claim 17, wherein, when replaying the first operation, the sequence of events are simulated to provide the user answer, thereby achieving the same state in the EDA environment as occurred when the first operation was previously performed by the user.

19. The computer-program product of claim 12, wherein the replay look-ahead instruction is associated with one or more user preferences that specify a configuration of the EDA environment.

20. The computer-program product of claim 19, wherein the configuration of the EDA environment includes a window size.

21. The computer-program product of claim 20, wherein, when replaying the first operation, a window in a graphical user interface is configured based at least on the window size, thereby achieving the same state in the EDA environment as occurred when the first operation was previously performed by the user.

22. A computer system, comprising:
a processor;
memory; and
a program module, wherein the program module is stored in the memory and configured to be executed by the processor to replay a sequence of operations, which were previously performed by a user, in an EDA environment, the program module including:
instructions for accessing the sequence of operations and at least one replay look-ahead instruction in a log file associated with the EDA environment, wherein the replay look-ahead instruction provides operational information, which specifies how a first operation in the sequence of operations is to be performed, and wherein, in the absence of the replay look-ahead instruction, replaying the first operation does not result in the same state in the EDA environment as occurred when the first operation was previously performed by the user; and instructions for performing the sequence of operations, wherein performing the first operation in the sequence of operations is based at least on the replay look-ahead instruction.

23. The computer system of claim 22, wherein the replay look-ahead instruction is associated with an interrupt, provided by the user, when the first operation was previously performed, wherein the replay look-ahead instruction specifies when the interrupt occurred during the performance of the first operation, wherein, when replaying the first operation, the effect of the interrupt is simulated, thereby achieving the same state in the EDA environment as occurred when the first operation was previously performed by the user.

24. The computer system of claim 22, wherein the replay look-ahead instruction is associated with a blocking user-interface request that occurred when the first operation was previously performed, and wherein a user answer to the blocking user-interface request is required in order for the first operation to complete, wherein when the first operation was previously performed by the user, the user answer included a sequence of events, wherein, when replaying the first operation, the sequence of events are simulated to provide the user answer, thereby achieving the same state in the EDA environment as occurred when the first operation was previously performed by the user.

25. The computer system of claim 22, wherein the replay look-ahead instruction is associated with one or more user preferences that specify a configuration of the EDA environment, wherein the configuration of the EDA environment includes a window size, wherein, when replaying the first operation, a window in a graphical user interface is configured based at least on the window size, thereby achieving the same state in the EDA environment as occurred when the first operation was previously performed by the user even if a display size is different relative to a display size when the first operation was previously performed by the user.

* * * * *